(12) United States Patent
Kizaki (10) Patent No.: US 6,608,525 B2
(45) Date of Patent: Aug. 19, 2003

(54) OPERATIONAL TRANSCONDUCTANCE AMPLIFIER AND FILTER CIRCUIT

(75) Inventor: Yoshihiro Kizaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/096,862

(22) Filed: Mar. 14, 2002

(65) Prior Publication Data

US 2003/0011429 A1 Jan. 16, 2003

(30) Foreign Application Priority Data

Jul. 4, 2001 (JP) ........................................ 2001-204020

(51) Int. Cl.[7] ................................................ H03F 3/45
(52) U.S. Cl. .......................... 330/253; 330/11; 330/258; 330/259
(58) Field of Search ............................ 330/11, 253, 258, 330/259

(56) References Cited

U.S. PATENT DOCUMENTS 5,384,501 A * 1/1995 Koyama et al. ............ 330/253
5,701,102 A * 12/1997 Kuo ............................ 330/253

FOREIGN PATENT DOCUMENTS

| JP | 60-070588 | | 4/1985 |
| JP | 6268456 | * | 9/1994 |

OTHER PUBLICATIONS

Wu et al, "Design considerations for common–mode feedback circuits in fully–differential operational amplifiers with tuning" IEEE International Sympoisum on Circuits and Systems Jun. 11–14, 1991 pp 1363–1366 vol. 3.*

* cited by examiner

Primary Examiner—Michael B Shingleton
(74) Attorney, Agent, or Firm—Arent Fox Kintner Plotkin & Kahn, PLLC (57) ABSTRACT

The operational transconductance amplifier comprises a MOS field-effective transistor that controls the mutual conductance. The central voltage measurement circuit and the voltage addition circuit shift a gate voltage of the MOS field-effective transistor by an amount equal to the deviation of a source voltage of the MOS field-effective transistor caused by an input offset voltage Voff.

3 Claims, 9 Drawing Sheets

| ITEM | FIRST EMBODIMENT | | | | UNIT |
|---|---|---|---|---|---|
| | min | avg | max | 3σ | |
| ATTENUATION AT SPACE OF -50kHz | 12.4 | 12.6 | 12.9 | 0.26 | dB |
| ATTENUATION AT SPACE OF +50kHz | 11.9 | 12.1 | 12.3 | 0.23 | dB |
| GROUP DELAY RIPPLE | — | 6.1 | 6.4 | 0.32 | μsec |
| GROUP DELAY | 12.3 | 12.7 | 13.1 | 0.38 | μsec |
| CURRENT CONSUMPTION | — | 774 | — | — | μA |

FIG.9

| ITEM | CONVENTIONAL ART | | | | UNIT |
|---|---|---|---|---|---|
| | min | avg | max | 3σ | |
| ATTENUATION AT SPACE OF -50kHz | 11.7 | 12.1 | 12.5 | 0.37 | dB |
| ATTENUATION AT SPACE OF +50kHz | 11.3 | 11.6 | 12.0 | 0.32 | dB |
| GROUP DELAY RIPPLE | — | 5.5 | 5.9 | 0.41 | μsec |
| GROUP DELAY | 11.5 | 12.0 | 12.5 | 0.51 | μsec |
| CURRENT CONSUMPTION | — | 763 | — | — | μA |

OPERATIONAL TRANSCONDUCTANCE AMPLIFIER AND FILTER CIRCUIT

FIELD OF THE INVENTION

The present invention relates to an operational transconductance amplifier ("OTA") which is an amplifier having a mutual conductance which can be controlled, and a filter circuit which uses the OTA. More particularly, this invention relates to the OTA and the filter circuit formed of complementary metal-oxide semiconductor ("CMOS") devices.

BACKGROUND OF THE INVENTION

The mutual conductance of the OTA depends on the input offset voltage. If a circuit is formed of a plurality of OTA's, therefore, dispersion of the circuit becomes great as a result of changes in mutual conductances of the OTS's. In order to prevent such dispersion, it is desirable to adopt a configuration in which the mutual conductance of each OTA is least affected by the input offset voltage.

Figure 1:
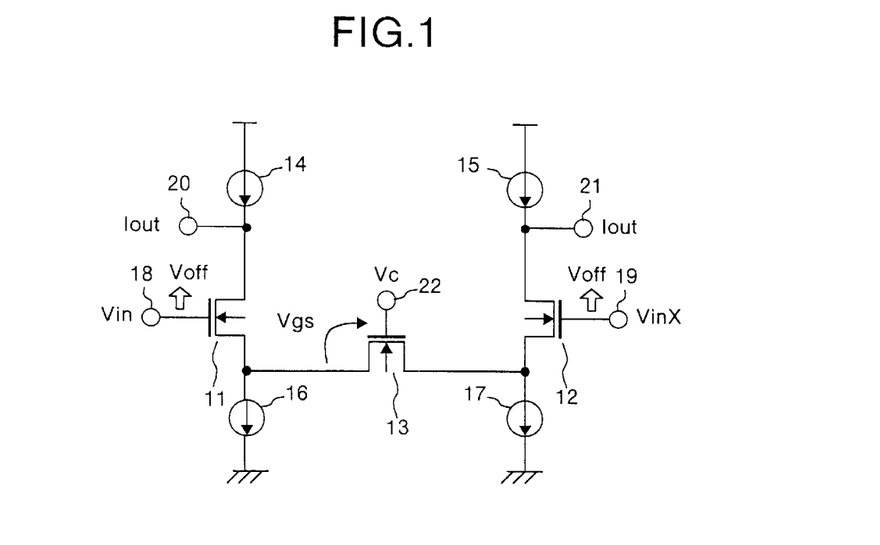
FIG. 1 is a circuit diagram which shows a configuration of a conventional OTA.

Conventionally, as an OTA formed of CMOS devices, an OTA having a configuration shown in FIG. 1 is known. As shown in FIG. 1, this OTA includes three N-channel MOSFET's ("NMOS field-effective transistors") 11, 12 and 13, four current sources 14, 15, 16 and 17, two input terminals 18 and 19, two output terminals 20 and 21, and a control voltage input terminal 22.

A first NMOS field-effective transistor 11 is connected at its gate to a first input terminal 18, to which an input voltage Vin is applied. The first NMOS field-effective transistor 11 is connected at its drain to a second output terminal 20, which outputs an output current IoutX. In addition, the first NMOS field-effective transistor 11 is connected at its drain to a power source terminal as well via a first current source 14. The first NMOS field-effective transistor 11 is connected at its source to a third NMOS field-effective transistor 13 at its source, and to ground via a third current source 16.

A second NMOS field-effective transistor 12 is connected at its gate to a second input terminal 19, to which an input voltage VinX is applied. The second NMOS field-effective transistor 12 is connected at its drain to a first output terminal 21, which outputs an output current Iout. In addition, the second NMOS field-effective transistor 12 is connected at its drain to a power source terminal as well via a second current source 15. The second NMOS field-effective transistor 12 is connected at its source to the third NMOS field-effective transistor 13 at its drain, and to the ground via a fourth current source 17. The third NMOS field-effective transistor 13 is connected at its gate to a control voltage input terminal 22, to which a control voltage Vc is applied from the outside.

In this conventional OTA, mutual conductance is controlled by adjusting the control voltage Vc and thereby changing the resistance of the third NMOS field-effective transistor 13. Mutual conductance Gm of the OTA can be represented by using a gate-source voltage Vgs and a threshold voltage Vth of the third NMOS field-effective transistor 13 and a transconductance factor K as indicated by the following equation (1).

$$Gm = K(Vgs - Vth) \tag{1}$$

Typically, in the OTA, an input offset voltage of approximately several tens mV exists. Therefore, the voltage of the source of the third NMOS field-effective transistor 13 rises by a voltage corresponding to the input offset voltage. Denoting the input offset voltage by Voff, the equation (1) changes to the following equation (2). In other words, the conventional OTA has a problem that the mutual conductance is shifted from its preset value by −KVoff when the input offset voltage is Voff.

$$\begin{aligned} Gm &= K(Vgs - Voff - Vth) \\ &= K(Vgs - Vth) - Voff \end{aligned} \tag{2}$$

SUMMARY OF THE INVENTION

It is an object of the present invention to provide an OTA in which the deviation of the mutual conductance caused by the input offset voltage is nearly zero, and provide a filter circuit that uses such OTA's.

The operational transconductance amplifier according to one aspect of the present invention comprises a MOS field-effective transistor having a gate, wherein a resistance of the MOS field-effective transistor changes according to a voltage applied to the gate and transconductance is changed according to the changed resistance, a center voltage measurement circuit which measures a center voltage of two input voltages and outputs one of a voltage and a current based on the measured center voltage, and a voltage addition circuit which supplies the gate of the MOS field-effective transistor with a voltage obtained by adding the voltage or current output from the center voltage measurement circuit to a control voltage or a control current.

The operational transconductance amplifier according to another aspect of the present invention comprises a MOS field-effective transistor having a gate, wherein a resistance of the MOS field-effective transistor changes according to a voltage applied to the gate and transconductance is changed according to the changed resistance, a first voltage addition circuit which outputs one of a voltage and a current obtained by adding a voltage or current based on a first input voltage to a control voltage or a control current, a second voltage addition circuit which outputs one of a voltage and a current obtained by adding a voltage or current based on a second input voltage to the control voltage or the control current, and a center voltage measurement circuit which measures a center voltage of the voltage or the current output from the first voltage addition circuit and the voltage or the current output from the second voltage addition circuit, and which supplies a voltage based on the measured center voltage to the gate of the MOS field-effective transistor.

The operational transconductance amplifier according to still another aspect of the present invention comprises a plurality of MOS field-effective transistors each having a gate, wherein a resistance of each of the MOS field-effective transistors changes according to a voltage applied to the gate and transconductance is changed according to the changed resistance, wherein the MOS field-effective transistors being connected so that resistors having the same resistance will be connected in series according to the gate voltage, and which output one of a voltage and a current based on a center voltage of two input voltages, from a node of the resistors connected in series, and a voltage addition circuit which supplies the gates of the MOS field-effective transistors with a voltage obtained by adding the voltage or current output from the node of the MOS field-effective transistors to a control voltage or a control current.

The filter circuit according to still another aspect of the present invention comprises a plurality of operational transconductance amplifiers according to the above-mentioned aspects.

Other objects and features of this invention will become apparent from the following description with reference to the accompanying drawings.

DETAILED DESCRIPTIONS

According to the present invention, the object is achieved by shifting a gate voltage of a field-effect transistor, which is used to control the mutual conductance, by a magnitude equivalent to deviation of a source voltage caused by an input offset voltage, thereby preventing a gate-source voltage from changing, and suppressing the deviation of the mutual conductance to nearly zero. When the gate voltage is shifted according to a change of the source voltage caused by the input offset voltage, the change V1 of the gate voltage is represented by V1=Voff and the mutual conductance Gm is given by the following equation (3). Therefore, it will be appreciated that the mutual conductance is not affected by the input offset.

$$Gm = K(Vgs - Voff - Vth + V1) \quad (3)$$
$$= K(Vgs - Vth)$$

Figure 2:
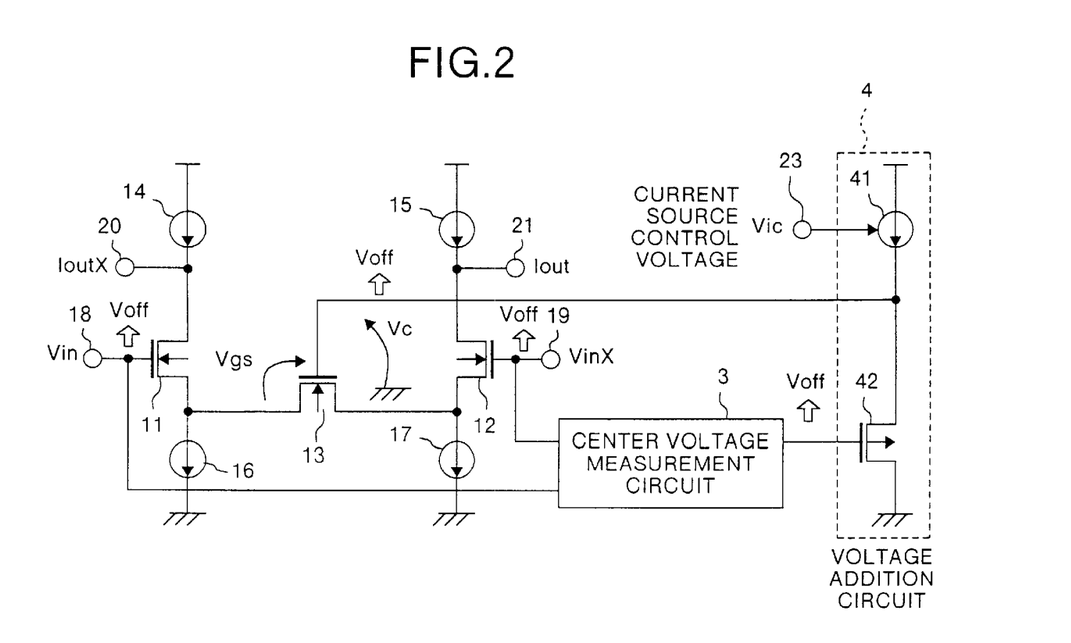
FIG. 2 is a principle diagram which shows a first configuration of an OTA according to the present invention.

In order to shift the gate voltage by a magnitude equivalent to the deviation of the source voltage as explained above, the following configuration is employed. The same components as those of the conventional OTA shown in FIG. 1 are denoted by like characters, and description thereof will be omitted. FIG. 2 is a principle diagram which shows a first configuration of an OTA according to the present invention. This OTA has a configuration such that a center voltage measurement circuit 3 and a voltage addition circuit 4 are added the conventional OTA. As already explained above, the conventional OTA has three NMOS field-effective transistors 11, 12 and 13, four current sources 14, 15, 16 and 17, two input terminals 18 and 19, two output terminals 20 and 21, and a control voltage input terminal 22. The center voltage measurement circuit 3 outputs a center voltage of two voltages respectively applied to two input terminals 18 and 19. This center voltage changes by the input offset voltage. In other words, if the input voltage rises by the input offset voltage is Voff, then the output voltage of the center voltage measurement circuit 3 also rises by Voff.

The voltage addition circuit 4 has a source follower, which includes a voltage controlled current source 41, and a P-channel MOSFET's ("PMOS field-effective transistors") 42, which receives the output of the center voltage measurement circuit 3 as its gate input. An output of the voltage addition circuit 4 is supplied to a third NMOS field-effective transistor 13 at its gate as a control voltage Vc. The voltage addition circuit 4 is formed of the source follower. If the output voltage of the center voltage measurement circuit 3, i.e., the input of the source follower rises by Voff, therefore, the control voltage Vc output from the voltage addition circuit 4 also rises by Voff. In other words, in case of the third NMOS field-effective transistor 13, even if the source voltage deviates by Voff as a result of the input offset, the gate voltage also deviates by Voff, and consequently the gate-source voltage does not change. Therefore, the mutual conductance does not change. The control voltage Vc is controlled by a current source control voltage Vic, which is input from the outside to a current source control voltage input terminal 23 in order to control the voltage controlled current source 41.

Figure 3:
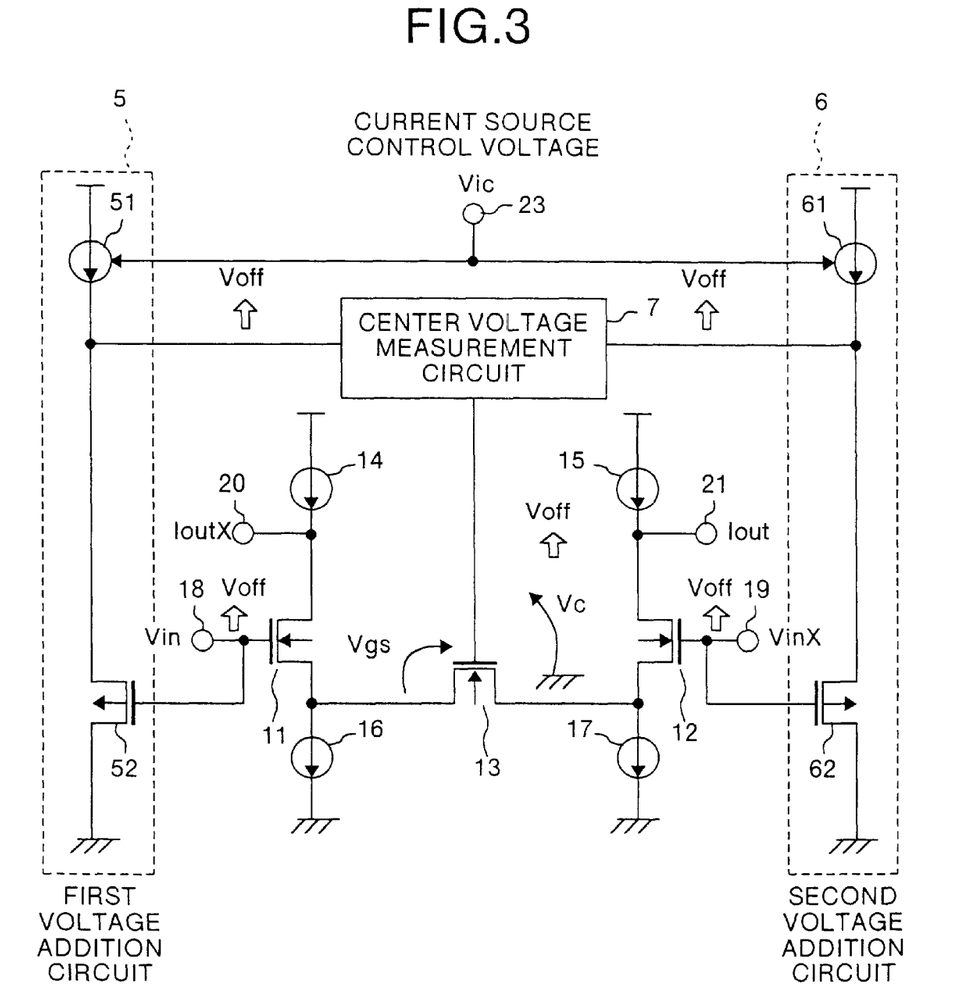
FIG. 3 is a principle diagram which shows a second configuration of an OTA according to the present invention.

FIG. 3 is a principle diagram which shows a second configuration of an OTA according to the present invention. This OTA is obtained by adding a first voltage addition circuit (voltage addition circuit 1) 5, a second voltage addition circuit (voltage addition circuit 2) 6, and a center voltage measurement circuit 7 into the conventional OTA. As already explained above, the conventional OTA has three NMOS field-effective transistors 11, 12 and 13, four current sources 14, 15, 16 and 17, two input terminals 18 and 19, two output terminals 20 and 21, and a control voltage input terminal 22.

The first voltage addition circuit 5 has a source follower, which includes a voltage controlled current source 51, and a PMOS field-effective transistor 52, which receives an input of the first input terminal 18 as its gate input. The second voltage addition circuit 6 has a source follower, which includes a voltage controlled current source 61, and a PMOS field-effective transistor 62, which receives an input of the second input terminal 19 as its gate input. The center voltage measurement circuit 7 supplies a center voltage of two voltages output from the first and second voltage addition circuits 5 and 6 to a third NMOS field-effective transistor 13 at its gate as a control voltage Vc.

Each of the two voltage addition circuits 5 and 6 is formed of the source follower. If the input voltage rises by the offset voltage Voff, therefore, the output voltage of the two voltage addition circuits 5 and 6 also rises by Voff. Therefore, the control voltage Vc output from the center voltage measurement circuit 7 also rises by Voff. In other words, as regards the third NMOS field-effective transistor 13, even if the source voltage deviates by Voff as a result of the input offset, the gate voltage also deviates by Voff, and consequently the gate-source voltage does not change. Therefore, Gm does not change. The control voltage Vc is controlled by a current source control voltage Vic, which is input from the outside to a current source control voltage input terminal 23 in order to control the voltage controlled current sources 51 and 61.

Figure 4:
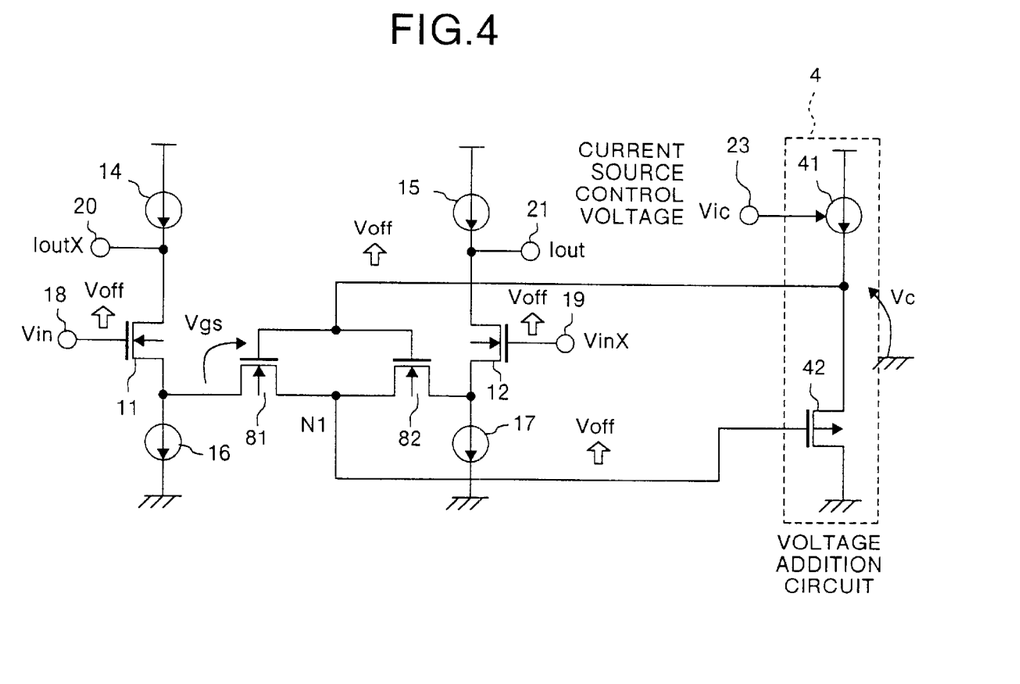
FIG. 4 is a principle diagram which shows a third configuration of an OTA according to the present invention.

FIG. 4 is a principle diagram which shows a third configuration of an OTA according to the present invention. This OTA is obtained by replacing the third NMOS field-effective transistor 13, of the OTA shown in FIG. 2, which receives the control voltage Vc as the gate input, with two NMOS field-effective transistors 81 and 82 having the same characteristic and providing the NMOS field-effective transistors 81 and 82 with the mutual conductance control function using the control voltage Vc and the function of the center voltage measurement circuit. In other words, resistance of each of the NMOS field-effective transistors 81 and 82 depends upon the control voltage Vc input to its gate, and the mutual conductance changes according to the change of the resistance.

If the input voltage rises by the input offset voltage Voff, a voltage at a node N1 between the NMOS field-effective transistors 81 and 82 rises by Voff in keeping therewith. The voltage at the node N1 becomes an input of a source follower of a voltage addition circuit 4. If the voltage at the node N1 rises by voltage Voff, an output of the source follower, i.e., the control voltage Vc also rises by Voff in keeping therewith. In other words, in each of the NMOS field-effective transistors 81 and 82 used instead of the third NMOS field-effective transistor 13, both its source voltage and gate voltage deviate by Voff and consequently the gate-source voltage does not change. Therefore, Gm does not change.

Embodiments of the present invention will be described in detail below while referring to the accompanying drawings.

Figure 5:
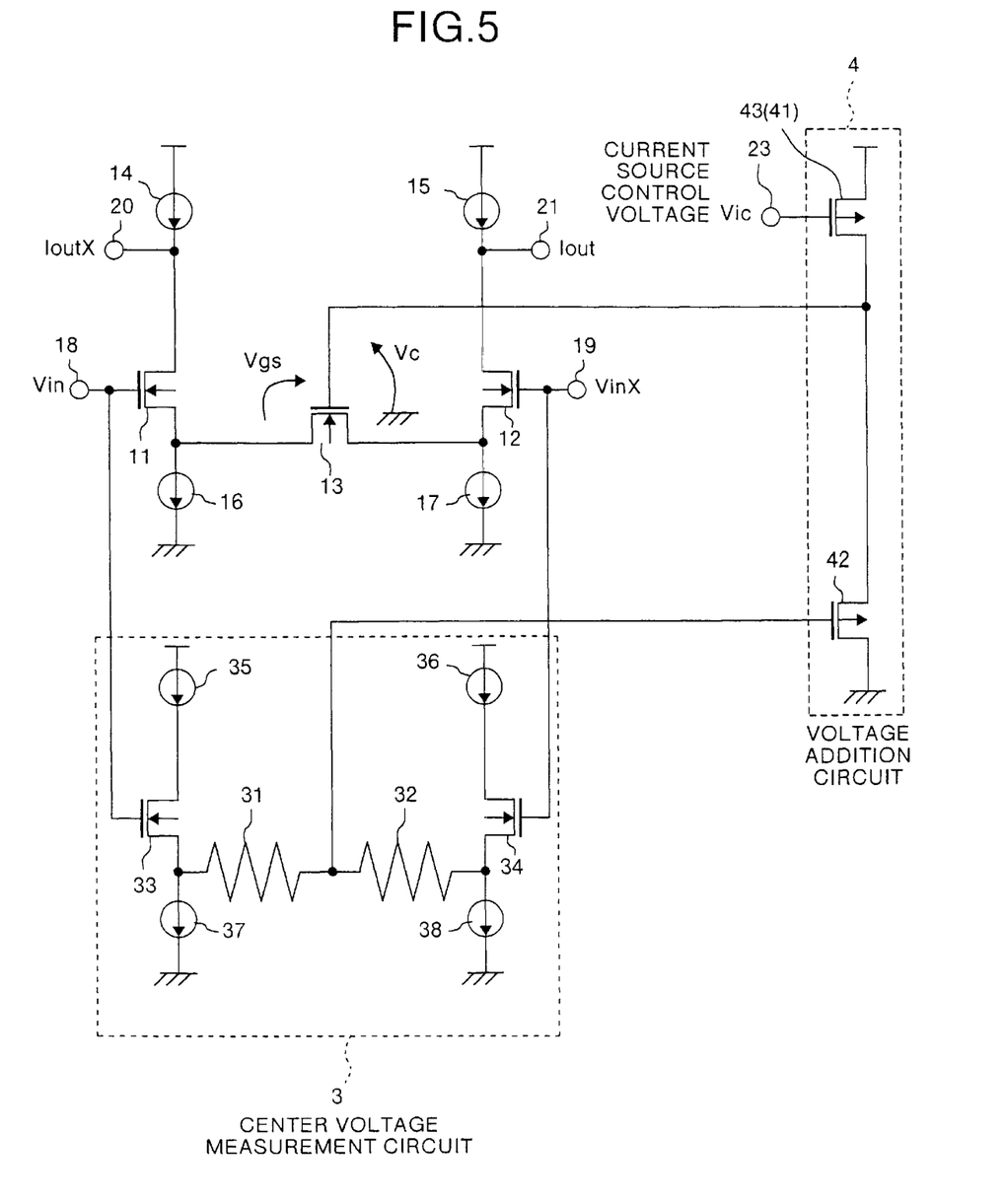
FIG. 5 is a circuit diagram which shows a configuration of an OTA according to a first embodiment of the present invention.

FIG. 5 is a circuit diagram which shows a configuration of an OTA according to a first embodiment of the present invention. The first embodiment is an embodiment of the OTA of the first configuration shown in FIG. 2. In FIG. 5, therefore, the same components as those in FIG. 2 are denoted by like characters with those of FIG. 2.

In the first embodiment, the third NMOS field-effective transistor 13 is connected at its source and drain between sources of the first NMOS field-effective transistor 11 and the second NMOS field-effective transistor 12 as shown in FIG. 5. The third NMOS field-effective transistor 13 receives a control voltage Vc as its gate input. The resistance of the third NMOS field-effective transistor 13 changes according to the magnitude of the control voltage Vc. Thus, the mutual conductance can be controlled by changing the resistance of the third NMOS field-effective transistor 13. The first NMOS field-effective transistor 11 receives the input voltage Vin as its gate input, and outputs the output current IoutX as its drain current. The second NMOS field-effective transistor 12 receives the input voltage VinX as its gate input, and outputs the output current Iout as its drain current.

The center voltage measurement circuit 3 includes two resistors 31 and 32 having the same resistance, two NMOS field-effective transistors 33 and 34, and four current sources 35, 36, 37 and 38. The resistors 31 and 32 are connected in series between sources of the fourth NMOS field-effective transistor 33 and the fifth NMOS field-effective transistor 34. Voltage at a node of the two resistors 31 and 32 is supplied to a voltage addition circuit 4 as an output of the center voltage measurement circuit 3.

The fourth NMOS field-effective transistor 33 is connected at its gate to a first input terminal 18, to which an input voltage Vin is applied. The fourth NMOS field-effective transistor 33 is connected at its drain to a power source terminal via a fifth current source 35. The fourth NMOS field-effective transistor 33 is connected at its source to ground via a seventh current source 37. The fifth NMOS field-effective transistor 34 is connected at its gate to a second input terminal 19, to which the input voltage VinX is applied. The fifth NMOS field-effective transistor 34 is connected at its drain to a power source terminal via an eighth current source 38. The fifth NMOS field-effective transistor 34 is connected at its source to ground via the eighth current source 38.

The voltage addition circuit 4 has a source follower including a PMOS field-effective transistor 43, which forms a voltage controlled current source 41, and a PMOS field-effective transistor 42, which receives the output of the center voltage measurement circuit 3 as its gate input. An output of the source follower is supplied to the gate of the third NMOS field-effective transistor 13 as the control voltage Vc. The PMOS field-effective transistor 43 forming the voltage controlled current source 41 receives a current source control voltage Vic supplied from the outside as its gate input, and controls the magnitude of the control voltage Vc according to the current source control voltage Vic.

If the input voltage changes by the input offset voltage Voff in the OTA having the configuration shown in FIG. 5, then the source voltage of the third NMOS field-effective transistor 13 changes by Voff. Further, if the input voltage changes by the input offset voltage Voff, then the output voltage of the center voltage measurement circuit 3 changes by Voff. The voltage addition circuit 4 is formed of the source follower as explained above. If the input voltage of the source follower supplied from the center voltage measurement circuit 3 changes by Voff, therefore, the control voltage Vc output from the voltage addition circuit 4 changes by Voff. Since the control voltage Vc is the gate voltage of the third NMOS field-effective transistor 13, both the gate voltage and the source voltage of the third NMOS field-effective transistor 13 change by Voff. Accordingly, the gate-source voltage of the third NMOS field-effective transistor 13 does not change whether Voff is present or not and whether Voff is large or small. Therefore, Gm of the OTA does not change.

Two verifications were made by the present inventors in order to ascertain the effectiveness of the OTA having the configuration shown in FIG. 5. The OTA shown in FIG. 5 and the conventional OTA shown in FIG. 1 were compared. In a first verification, the input voltages Vin and VinX of each OTA is swept in the same direction in the range of −0.08 V to 0.08 V assuming that offset voltages are applied thereto, and a change of the mutual conductance Gm is checked.

Figure 6:
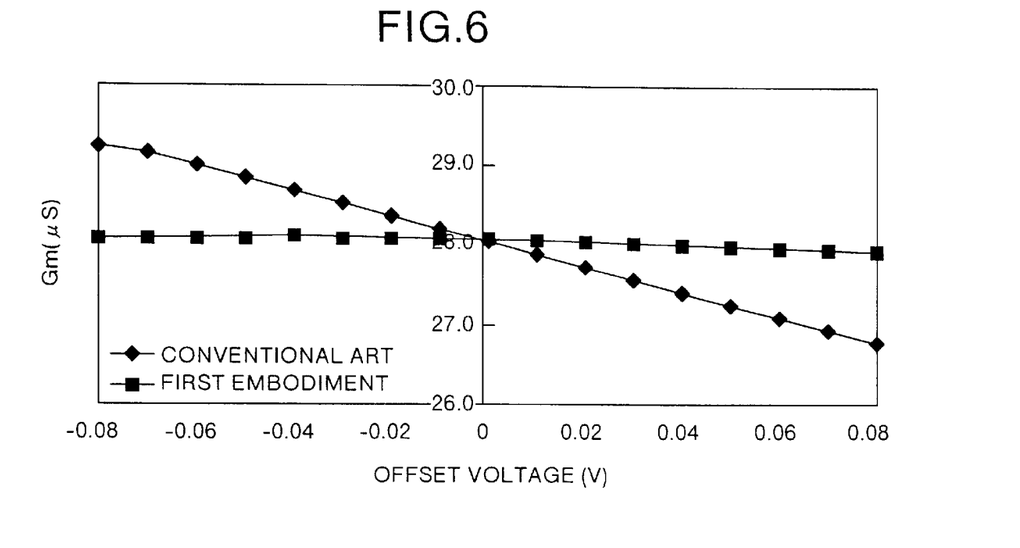
FIG. 6 is a characteristic diagram which shows a verification result of the OTA shown in FIG. 5.

The technology is 0.35 μm, and the power source voltage is 2.8 V. A result of the first verification is shown in FIG. 6. As apparent from FIG. 6, the change of the mutual conductance Gm in the sweep range is nearly zero in the OTA of the first embodiment, whereas the mutual conductance changes greatly in the OTA of the conventional art. As a result, it can be ascertained that the deviation of the mutual conductance can be suppressed to nearly zero in the first embodiment even if there is an input offset voltage.

Figure 7:
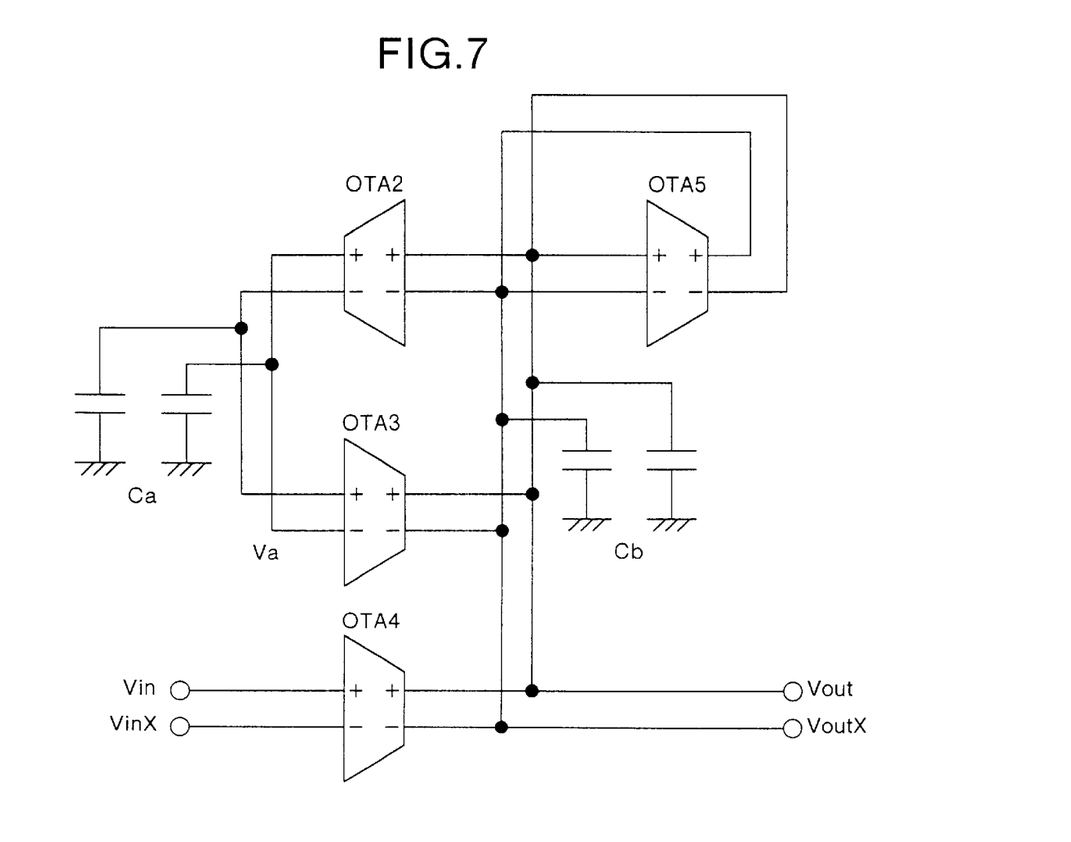
FIG. 7 is a circuit diagram which shows a configuration of a bi-quad circuit used in the verification.

As a second verification, band pass filters formed of second-order bi-quad circuits having a configuration shown in FIG. 7 are fabricated by using the OTA shown in FIG. 5 and the conventional OTA shown in FIG. 1 serving as the subject of comparison, and the Monte Carlo simulation of SPICE is conducted to check dispersion. A center frequency of the band pass filter is 450 kHz, and an attenuation at 450±50 kHz is 10 dB. In FIG. 7, OTA2, OTA3, OTA4 and OTA5 are OTA'S, and Ca and Cb are capacitors.

Figure 8:
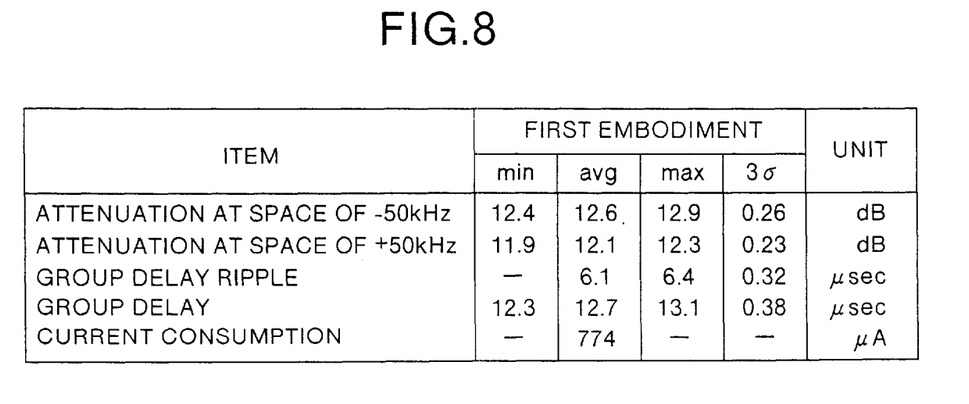
FIG. 8 is a table which shows a result of simulation conducted on the bi-quad circuit of FIG. 7 formed by using the OTA shown in FIG. 5.
Figure 9:
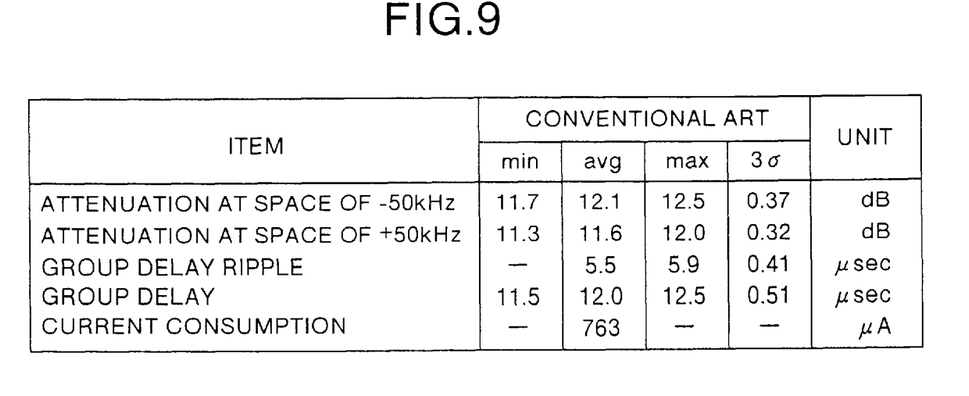
FIG. 9 is a table which shows a result of simulation conducted on the bi-quad circuit of FIG. 7 formed by using a conventional OTA shown in FIG. 1.

Simulation results of the band pass filter using the OTA shown in FIG. 5 and the band pass filter using the OTA shown in FIG. 1 are shown in FIGS. 8 and 9, respectively. In the band pass filter using the OTA of the present first embodiment, 3δ of an attenuation at a space of −50 kHz is 0.26 and 3δ of an attenuation at a space of +50 kHz distance is 0.23 (see FIG. 8). On the other hand, in the band pass filter using the OTA of the conventional art, 3δ of an attenuation at −50 kHz distance is 0.37 and 3δ of an attenuation at +50 kHz distance is 0.32. Both of them are greater as compared with the band pass filter using the OTA of the present first embodiment. In other words, it has been confirmed that the circuit using the OTA of the present first embodiment is smaller in dispersion than the circuit using the OTA of the conventional art.

In the first embodiment, the gate voltage of the third NMOS field-effective transistor 13 used to control the mutual conductance Gm is shifted by a magnitude equivalent to the deviation of the source voltage caused by the input offset voltage. Accordingly, the gate-source voltage of the third NMOS field-effective transistor 13 is prevented from changing. The deviation of the mutual conductance Gm is thus suppressed to nearly zero. As a result, an OTA in which the deviation of Gm caused by the input offset voltage is nearly zero and a filter circuit using such OTA's are obtained.

Figure 10:
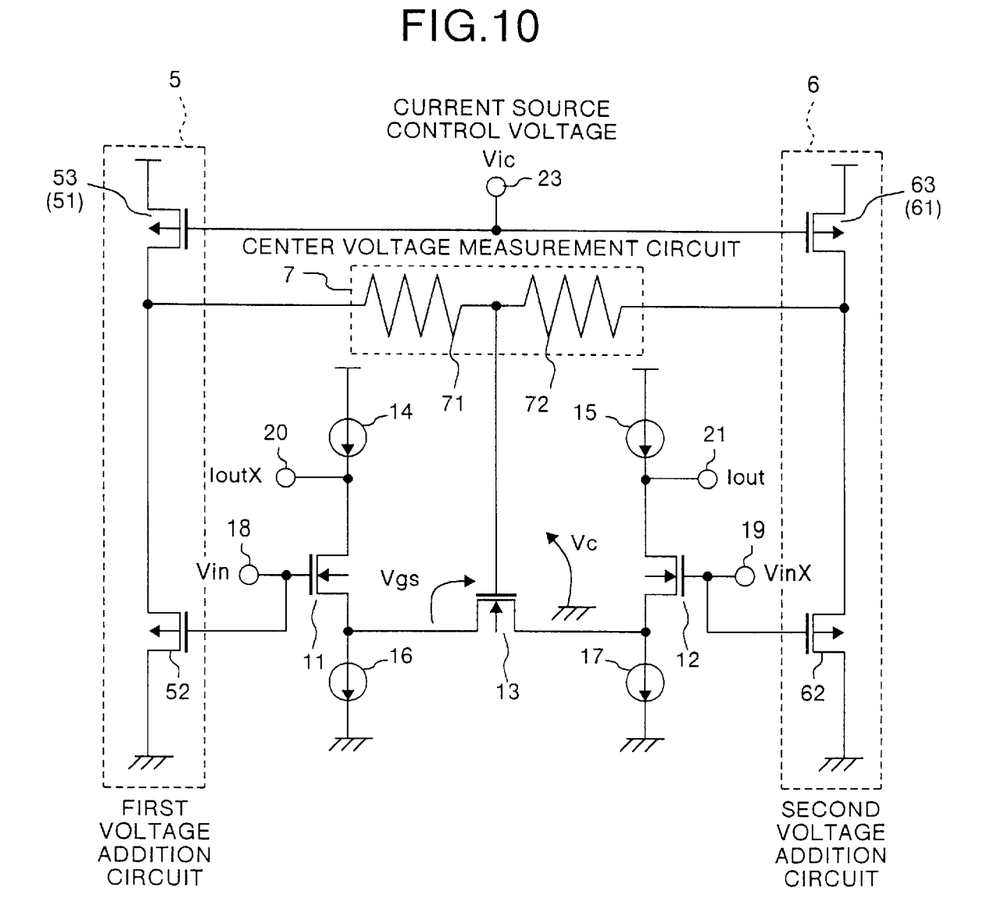
FIG. 10 is a circuit diagram which shows a configuration of an OTA according to a second embodiment of the present invention.

FIG. 10 is a circuit diagram which shows a configuration of an OTA according to a second embodiment of the present invention. The second embodiment is an embodiment of the OTA of the second configuration shown in FIG. 3. In FIG. 10, therefore, the same components as those in FIG. 3 are denoted by like characters with those of FIG. 3. In the second embodiment, the basic configuration of the OTA including the first NMOS field-effective transistor 11, the second NMOS field-effective transistor 12 and the third NMOS field-effective transistor 13 is the same as that of the first embodiment. Moreover, the mutual conductance is controlled by changing the resistance of the third NMOS field-effective transistor 13 in the same as the first embodiment.

The first voltage addition circuit 5 has a source follower including a PMOS field-effective transistor 53, which forms a voltage controlled current source 51, and the PMOS field-effective transistor 52, which receives an input voltage Vin as its gate input. The PMOS field-effective transistor 53 forming the voltage controlled current source 51 receives a current source control voltage Vic supplied from the outside as its gate input, and supplies a voltage according to the current source control voltage Vic to the center voltage measurement circuit 7. The second voltage addition circuit 6 has a source follower including a PMOS field-effective transistor 63, which forms a voltage controlled current source 61, and the PMOS field-effective transistor 62, which receives an input voltage VinX as its gate input. The PMOS field-effective transistor 63 forming the voltage controlled current source 61 receives a current source control voltage Vic supplied from the outside as its gate input, and supplies a voltage according to the current source control voltage Vic to the center voltage measurement circuit 7.

The center voltage measurement circuit 7 includes two resistors 71 and 72 having the same resistance. These two resistors 71 and 72 are connected in series between an output terminal of the source follower of the first voltage addition circuit 5 and an output terminal of the source follower of the second voltage addition circuit 6. Voltage at a node of these two resistors 71 and 72 is supplied to the gate of the third NMOS field-effective transistor 13 as the control voltage Vc.

If the input voltage changes by the input offset voltage Voff in the OTA having the configuration shown in FIG. 10, then the source voltage of the third NMOS field-effective transistor 13 changes by Voff. Further, if the input voltage changes by the input offset voltage Voff, then each of the output voltage of the first voltage addition circuit 5 and the output voltage of the second voltage addition circuit 6 also changes by Voff, because each of the output voltage of the first voltage addition circuit 5 and the output voltage of the second voltage addition circuit 6 is formed of a source follower as explained above. Accordingly, the control voltage Vc output from the center voltage measurement circuit 7 also changes by Voff. Therefore, both the gate voltage and the source voltage of the third NMOS field-effective transistor 13 change by Voff. Accordingly, the gate-source voltage of the third NMOS field-effective transistor 13 does not change whether Voff is present or not and whether Voff is large or small. Therefore, Gm of the OTA does not change.

In the second embodiment, the gate voltage of the third NMOS field-effective transistor 13 used to control the mutual conductance Gm is shifted by a value equal to the deviation of the source voltage caused by the input offset voltage. Accordingly, the gate-source voltage of the third NMOS field-effective transistor 13 is prevented from changing. The deviation of the mutual conductance Gm is thus suppressed to nearly zero. As a result, an OTA in which the deviation of Gm caused by the input offset voltage is nearly zero and a filter circuit using such OTAs are obtained.

Figure 11:
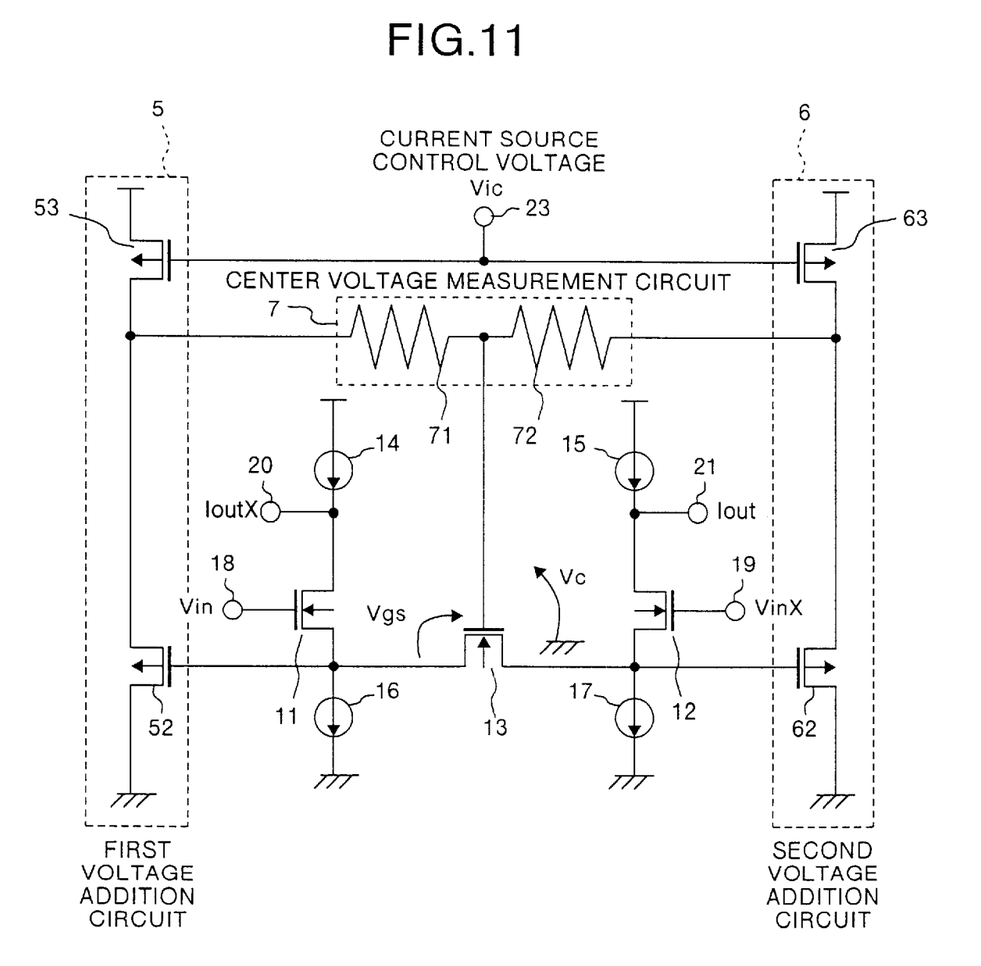
FIG. 11 is a circuit diagram which shows another configuration of an OTA according to the second embodiment of the present invention.

A similar effect is also obtained in a configuration shown in FIG. 11. In the configuration shown in FIG. 11, the source voltage of the first NMOS field-effective transistor 11, which receives the input voltage Vin as the gate input, is used instead of the input voltage Vin as the gate input of the PMOS field-effective transistor 52 forming the source follower of the first voltage addition circuit 5, and the source voltage of the second NMOS field-effective transistor 12, which receives the input voltage VinX as the gate input, is used as the gate input of the PMOS field-effective transistor 62 forming the source follower of the second voltage addition circuit 6.

Figure 12:
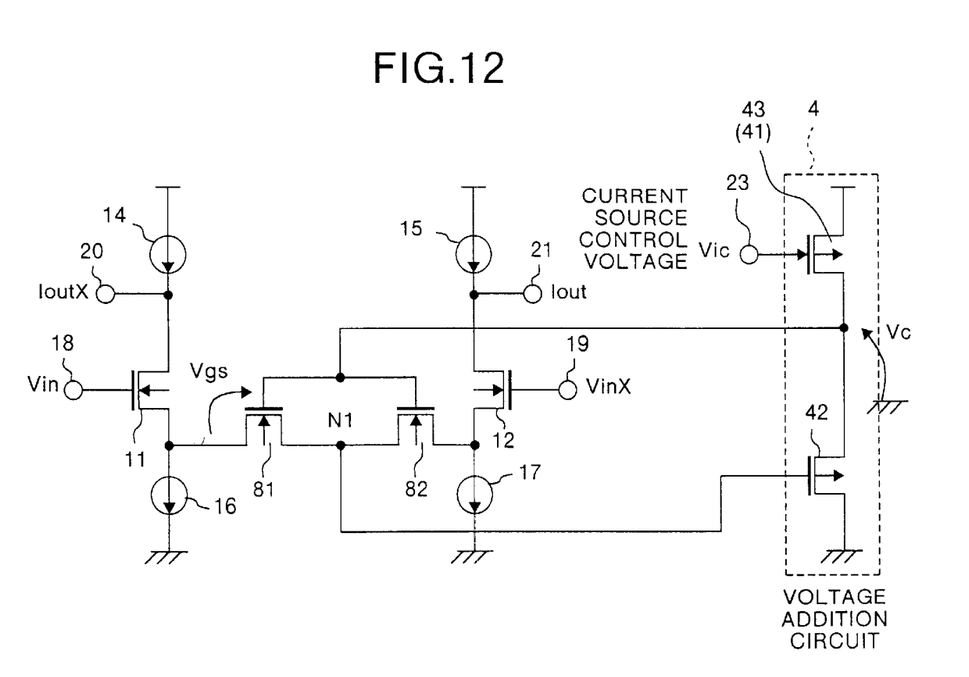
FIG. 12 is a circuit diagram which shows a configuration of an OTA according to a third embodiment of the present invention.

FIG. 12 is a circuit diagram which shows a configuration of an OTA according to a third embodiment of the present invention. The third embodiment is an embodiment of the OTA of the third configuration shown in FIG. 4. In FIG. 12, therefore, the same components as those in FIG. 4 are denoted by like characters with those of FIG. 4. In the third embodiment, the third NMOS field-effective transistor 13 in the first embodiment shown in FIG. 5 is replaced with two NMOS field-effective transistor, i.e., an NMOS field-effective transistor 81 and an NMOS field-effective transistor 82 having the same characteristic, and the control voltage Vc is supplied to gates of the NMOS field-effective transistors 81 and 82.

The NMOS field-effective transistor 81 is connected at its source to the source of the first NMOS field-effective transistor 11, which receives the input voltage Vin as the gate input. The NMOS field-effective transistor 81 is connected at its drain to the NMOS field-effective transistor 82 at its source. The NMOS field-effective transistor 82 is connected at its drain to the source of the second NMOS field-effective transistor 12, which receives the input voltage VinX as the gate input. In the third embodiment, the basic configuration of the OTA including the two NMOS field-effective transistors 81 and 82 instead of the first NMOS field-effective transistor 11, the second NMOS field-effective transistor 12 and the third NMOS field-effective transistor 13, and control the mutual conductance Gm is conducted by changing the resistance of the NMOS field-effective transistors 81 and 82 are the same as those of the first embodiment.

The NMOS field-effective transistors 81 and 82 have a function of the center voltage measurement circuit. Voltage at the node N1 of the NMOS field-effective transistors 81 and 82 is supplied to the gate of the PMOS field-effective transistor 42, which forms the source follower of the voltage addition circuit 4. The output of the source follower is supplied to gates of the NMOS field-effective transistors 81 and 82 instead of the third NMOS field-effective transistor 13 as the control voltage Vc.

If the input voltage in the OTA having the configuration shown in FIG. 12 changes by the input offset voltage Voff, then a voltage of the source of the NMOS field-effective transistor 81 connected to the source of the first NMOS field-effective transistor 11 changes by Voff, and a voltage of the drain of the NMOS field-effective transistor 82 connected to the source of the second NMOS field-effective transistor 12 changes by Voff. Therefore, the voltage at the node N1 of the NMOS field-effective transistors 81 and 82 also changes by Voff. This is equivalent to a Voff change of the source voltage of the NMOS field-effective transistor 82 connected to the source of the second NMOS field-effective transistor 12.

The voltage addition circuit 4 is formed of the source follower as explained above. If the voltage at the node N1, i.e., the input voltage of the source follower changes by Voff, therefore, the control voltage Vc output from the voltage addition circuit 4 changes by Voff. Since the control voltage Vc is the voltage applied to gates of the NMOS field-effective transistors 81 and 82 provided instead of the third NMOS field-effective transistor 13, both the gate voltage and the source voltage of the NMOS field-effective transistors 81 and 82 change by Voff. Accordingly, the gate-source voltage of each of the NMOS field-effective transistors 81 and 82 does not change whether Voff is present or not and whether Voff is large or small. Therefore, Gm of the OTA does not change.

In the third embodiment, the gate voltage of each of the NMOS field-effective transistors 81 and 82 used to control the mutual conductance Gm is shifted by a value equal to the deviation of the source voltage caused by the input offset voltage. Accordingly, the gate-source voltage of each of the NMOS field-effective transistors 81 and 82 is prevented from changing. The deviation of the mutual conductance Gm is thus suppressed to nearly zero. As a result, an OTA in which the deviation of Gm caused by the input offset voltage is nearly zero and a filter circuit using such OTAs are obtained.

In the third embodiment, the center voltage needs only be output from the node N1. Therefore, the number of transistors that replace the NMOS field-effective transistor 13 need not be two (i.e., the NMOS field-effective transistor 81 and 82). The number of transistors that replace the NMOS field-effective transistor 13 may be more than two. Moreover, all the transistors that replace the NMOS field-effective transistor 13 need not have the same resistance. Since the center voltage needs only be output from the node N1, it is only necessary that bilateral symmetry is obtained about N1 and the sum total of resistances on the left hand of N1 is equal to that on the right hand.

To be more concrete, the mirror type is required in order to obtain correlation. To implement the mirror type, all of the following conditions must be satisfied, the number of transistors located on the left hand should be equal to the number of transistors located on the right hand; the sum total of resistance values of transistors located on the left hand should be equal to the sum total of resistance values of transistors located on the right hand; and if transistors located on each of the left and right hands are formed of a plurality of transistors having different resistance values, resistances of corresponding transistors located on the left hand and the right hand should be the same.

The configuration of the present invention can be modified in various ways. The voltage addition circuit and the center voltage measurement circuit are not limited to the above-explained configuration. Further, the OTA according to the present invention is not limited to a filter circuit, but can be applied to various circuits using OTAs.

According to the present invention, the gate voltage of the transistor used to control the mutual conductance Gm is shifted by a magnitude equivalent to the deviation of the source voltage caused by the input offset voltage. Accordingly, the gate-source voltage is prevented from changing. The deviation of the mutual conductance Gm is thus suppressed to nearly zero. As a result, an OTA in which the deviation of Gm caused by the input offset voltage is nearly zero and a filter circuit using such OTAs are obtained.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An operational transconductance amplifier comprising:
   a MOS field-effective transistor having a gate, wherein a resistance of said MOS field-effective transistor changes according to a voltage applied to said gate and transconductance is changed according to the changed resistance;
   a center voltage measurement circuit which measures a center voltage of two input voltages and outputs one of a voltage and a current based on the measured center voltage; and
   a voltage addition circuit which supplies said gate of said MOS field-effective transistor with a voltage obtained by adding the voltage or current output from said center voltage measurement circuit to a control voltage or a control current.

2. The operational transconductance amplifier according to claim 1, wherein said voltage addition circuit comprises a source follower which in turn comprises at least one MOS field-effective transistor.

3. The operational transconductance amplifier according to claim 1, wherein said voltage addition circuit comprises at least one MOS field-effective transistor which serves as a voltage controlled current source which controls the control voltage or the control current based on a current source control voltage input from outside.

* * * * *